United States Patent
Spitz et al.

(10) Patent No.: US 7,675,156 B2
(45) Date of Patent: Mar. 9, 2010

(54) ELECTRICAL COMPONENT

(75) Inventors: Richard Spitz, Reutlingen (DE); Peter Urbach, Reutlingen (DE); Karin Hamsen, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/514,996

(22) PCT Filed: May 23, 2003

(86) PCT No.: PCT/DE03/01674

§ 371 (c)(1),
(2), (4) Date: May 6, 2005

(87) PCT Pub. No.: WO03/100855

PCT Pub. Date: Dec. 4, 2003

(65) Prior Publication Data

US 2005/0212125 A1 Sep. 29, 2005

(30) Foreign Application Priority Data

May 24, 2002 (DE) ............................ 102 23 322

(51) Int. Cl.
*H01L 23/31* (2006.01)
(52) U.S. Cl. .................. 257/687; 257/E23.193
(58) Field of Classification Search .............. 257/718, 257/E23.026, E23.116, E23.124, E23.193, 257/687–689

See application file for complete search history.

(56) References Cited

U.S. PATENT DOCUMENTS

| | | | | |
|---|---|---|---|---|
| 5,005,069 A | * | 4/1991 | Wasmer et al. | 257/687 |
| 5,464,261 A | * | 11/1995 | Alkhoury | 292/251 |
| 6,060,776 A | * | 5/2000 | Spitz et al. | 257/706 |
| 6,455,929 B1 | * | 9/2002 | Sheen | 257/690 |
| 6,667,545 B1 | * | 12/2003 | Spitz | 257/688 |

FOREIGN PATENT DOCUMENTS

| | | |
|---|---|---|
| DE | 43 41 269 | 6/1995 |
| DE | 195 49 202 | 7/1997 |
| DE | 100 05 183 | 8/2001 |

* cited by examiner

*Primary Examiner*—Lynne A. Gurley
*Assistant Examiner*—Colleen A Matthews
(74) *Attorney, Agent, or Firm*—Kenyon & Kenyon LLP

(57) ABSTRACT

An electrical component, e.g., a press-in diode, is provided, which is suited for high currents and which ensures reverse-polarity protection. The electrical component includes at least one chip which is connected via soldering layers to a lead wire and a base. In the event of a rising temperature caused by polarity reversal, the clamp-type connection between the individual parts of the electrical component, e.g., the lead wire and the base, is released since the connecting plastic sheath softens, resulting in the release of the clamp-type connection, thereby interrupting the electrical connection and thus a current flow. At normal operating temperature, the clamp-type connection between the individual parts of the diode is ensured via a plastic sheath and a plastic sleeve, with bulges of the lead wire and the base protruding into the plastic sheath, thereby making the connection particularly stable.

10 Claims, 3 Drawing Sheets

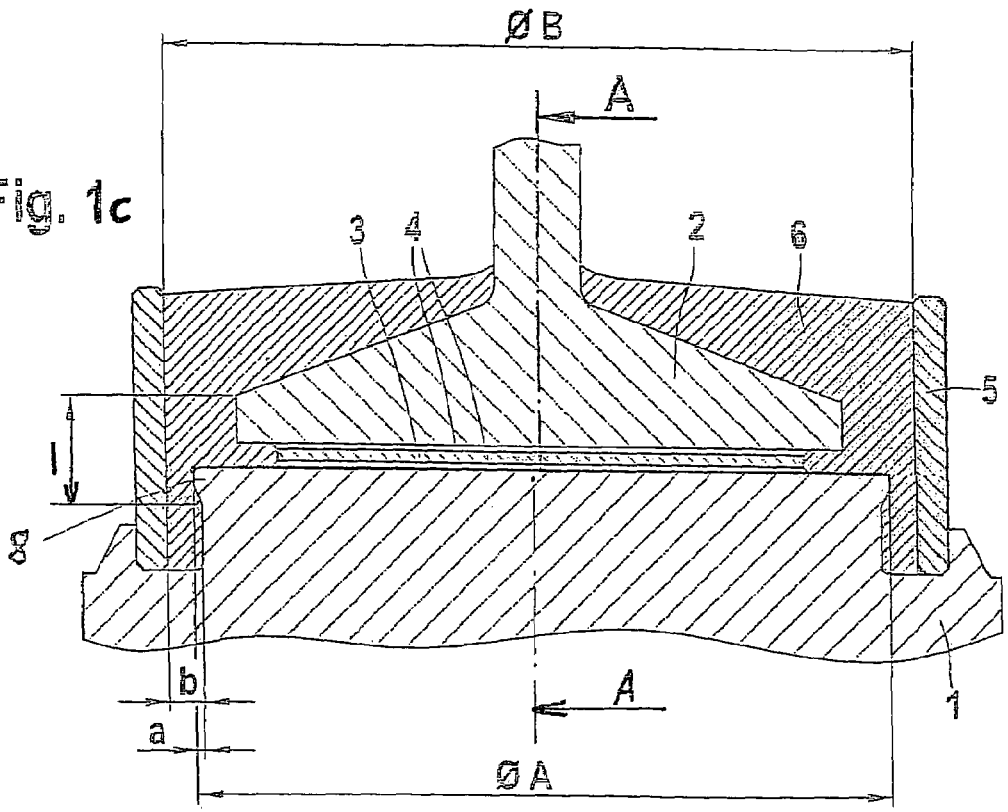
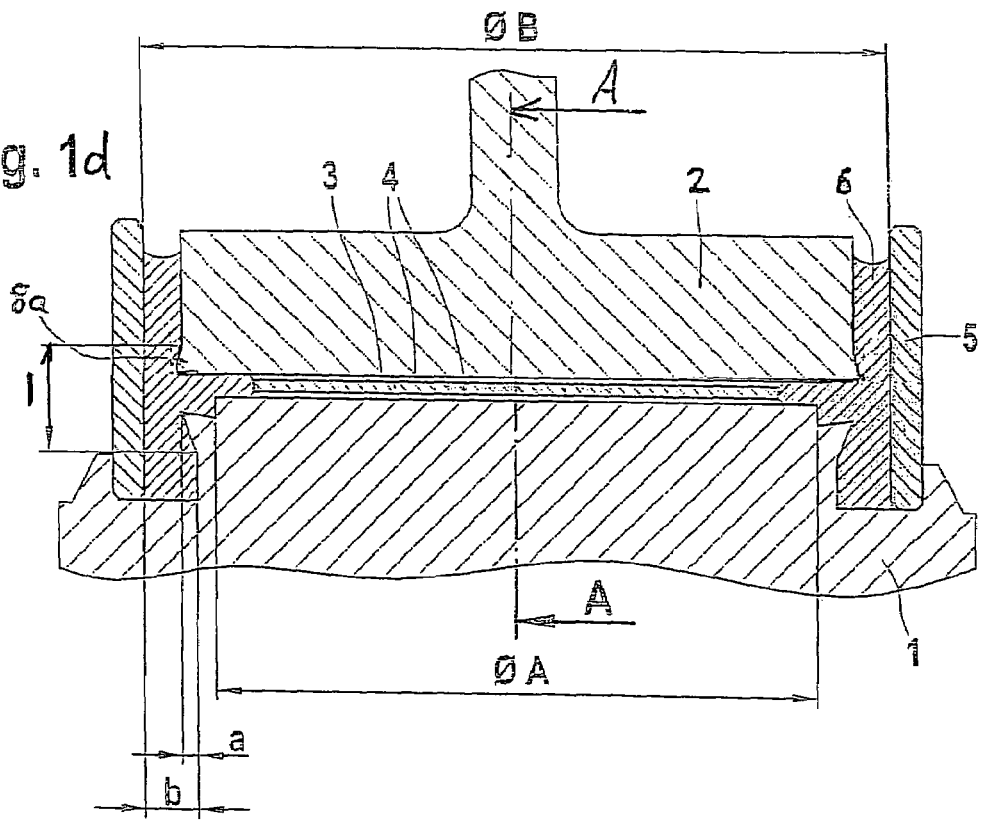

ELECTRICAL COMPONENT

FIELD OF THE INVENTION

The present invention relates to a press-in diode sheathed with plastic.

BACKGROUND INFORMATION

The basic construction features of press-in diodes which are sheathed with plastic are described in published German patent documents DE 43 41 269 and DE 195 49 202. An example of this type of diode is illustrated in FIGS. 3 and 4. Such press-in diodes are used in the rectifier bridge of alternators in motor vehicles, for example. Suitable reverse-polarity protection is necessary to prevent damage in the event of an incorrect connection of the vehicle battery. A reverse-polarity protection element, suitable for use in alternators in motor vehicles, is described in published German patent document DE 100 05 183.

SUMMARY OF THE INVENTION

The present invention provides an electrical component, e.g., a press-in diode sheathed with plastic, which operates securely and reliably in a wide temperature range, i.e., which may be used in such a wide temperature range. A secure clamp-type connection between the lead wire and the base is ensured in the usual operating temperature range of the diode (approximately 230° C.), and in the event of an over-temperature (approximately 400° C.), which may occur, for example, when the battery is connected with false polarity, the clamp-type connection disengages and causes an interruption in current flow, thereby avoiding further heating and at worst inflammation of the plastic.

These advantages are achieved by providing a diode, particularly a press-in diode, in which a chip, forming the p-n junction, is connected via soldering layers to two parts, particularly a lead wire and a base. The press-in diode is designed in such a way that, at least in the chip area, a plastic sheath and a sleeve form a connection which acts as a clamp-type connection, at least one part having a predefinable bulge which protrudes into the plastic sheath, thereby forming a fixed connection in the normal state. In the event of overheating, which occurs in the event of polarity reversal for example, i.e., connection of the electrical component to a voltage source with false polarity, the plastic softens and the clamp-type connection disengages, thereby interrupting the current flow through the electrical component, the diode, for example. The disengagement of the clamp-type connection is further increased if forces act which cause the two parts to be pulled or pushed apart when the plastic is softened. Such forces are created in an advantageous manner by the temperature-dependent expansion of the plastic.

It is advantageous that simple mechanically constructive features result in secure fixing and simultaneous reverse-polarity protection. This is particularly true for the advantageous use of the electrical component, a diode for example, in a rectifier system in a motor vehicle. If a short circuit occurs, e.g., as a result of an incorrect battery connection, the current flow through the diodes of the rectifier is interrupted and excessive overheating of vulnerable components is prevented so that flammable parts of the alternator or the supply lines cannot ignite. The selection of a suitable plastic or another material, which softens at desired temperatures, makes it possible to adjust the disengagement of the clamp-type connection within a certain temperature range.

BRIEF DESCRIPTION OF THE DRAWINGS

FIG. 1c shows another exemplary embodiment of a press-in diode according to the present invention.

FIG. 1d shows a further exemplary embodiment of a press-in diode according to the present invention.

DETAILED DESCRIPTION

Figure 1A:
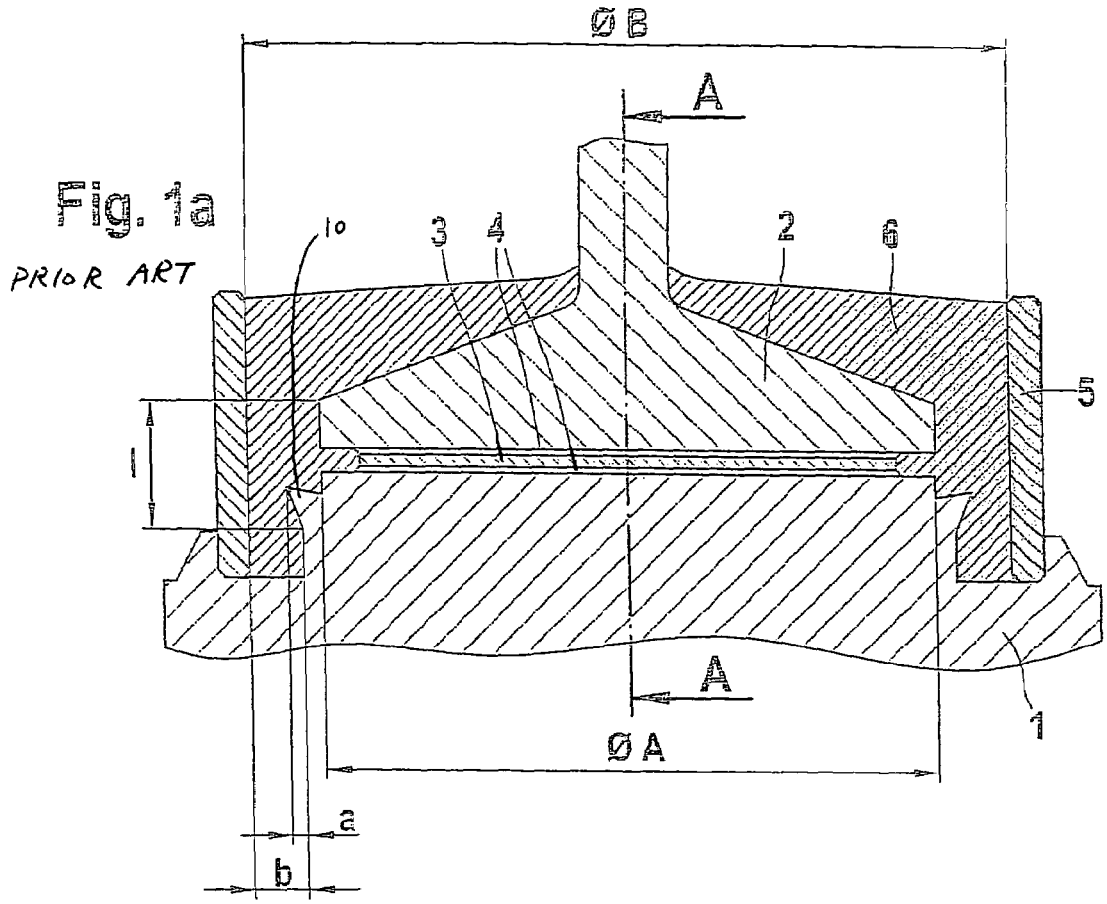
FIG. 1a shows a conventional press-in diode.
Figure 1B:
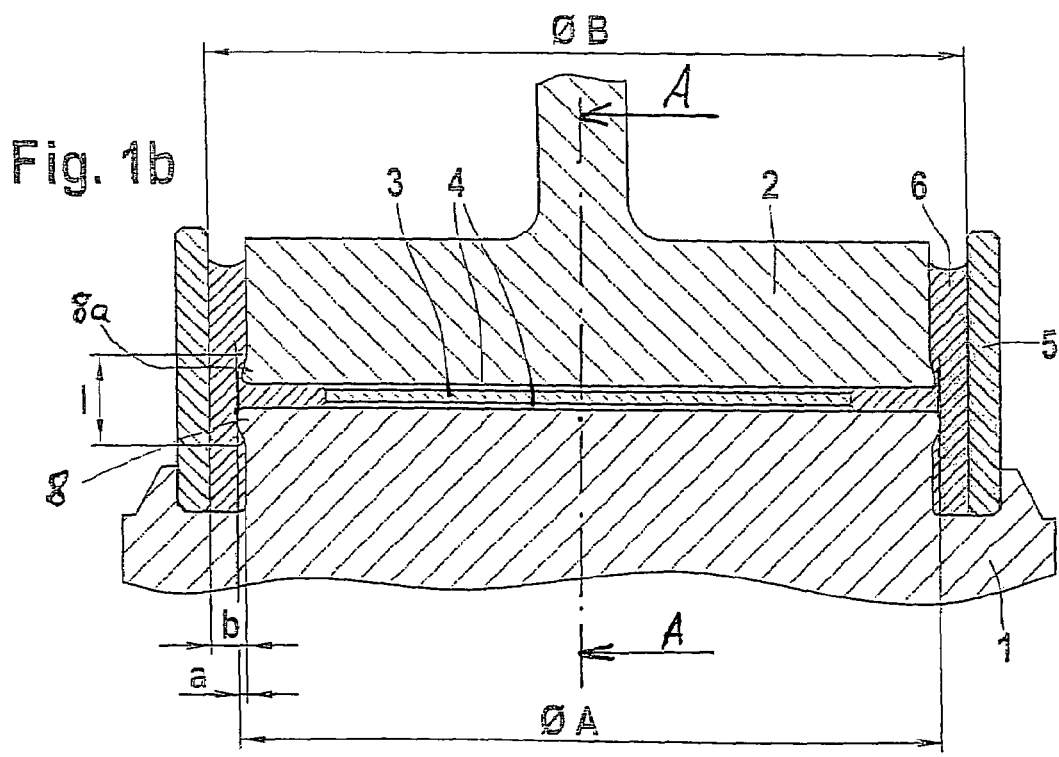
FIG. 1b shows an exemplary embodiment of a press-in diode according to the present invention.

FIG. 1b shows the electrical component (diode) according to the present invention, and FIG. 1a shows the component (diode) having a housing type described in published German patent document DE 195 49 202.

The diode (in both FIGS. 1a and 1b) is composed of a base 1, also referred to as first part, and a lead wire 2, also referred to as second part, the lead wire having a partly conical design in the known diode (FIG. 1a) and a partly cylindrical design in the approach according to the present invention (FIG. 1b). A chip 3, which forms the actual p-n junction, is mechanically and electrically connected to base 1 and lead wire 2 via two soldering layers 4. A protective sleeve 5 encloses at least the junction area between base 1 and lead wire 2 in which chip 3 is also situated, thus forming a type of housing together with base 1. The space between protective sleeve 5 and the remaining parts is filled with plastic 6.

In the diode shown in FIG. 1b, base 1 has an undercut 8 and the lead wire has an undercut 8a, which both protrude into plastic 6 causing a fixed connection when the plastic is firm. Base 1 and lead wire 2 are thus clamped together. The exemplary diode according to the present invention shown in FIG. 1b differs from the diode of FIG. 1a (e.g., described in published German patent document DE 195 49 202) in the arrangement and manufacture of undercut 8 on diode base 1 (as well as by arrangement and manufacture of undercut 8a on lead wire 2). The electrical component according to FIG. 1b is a fixed unit at usual temperatures, which component is stable even in the presence of forces which generally act between base 1 and lead wire 2 and would pull the two parts apart. In the known diode according to FIG. 1a, base 1 has only one bulge 10 protruding into plastic 6.

In addition to base 1, lead wire 2 may also be designed in such a way that it has its own undercut 8a, which protrudes into plastic 6, as shown in FIG. 1b.

When the electrical component is connected with a false polarity, a high current, causing excessive heating, flows between the two parts via the then conductive chip. Since the plastic also heats up at higher temperatures which occur in the event of a polarity reversal, the plastic also softens and expands with the rising temperature. Due to the expansion of the plastic in the area between the lead wire and the base, forces are created which push the lead wire and the base apart. However, since the plastic simultaneously softens at the high temperature of up to 400° C. prevailing during the polarity reversal, the fixed clamp-type connection between the parts disengages and the current flow between the two parts through the chip, which is conductive due to the polarity reversal, is interrupted, thereby achieving the desired reverse-polarity protection.

Two further embodiments according to the present invention are illustrated in FIGS. 1c and 1d, which represent the combinations of the approaches illustrated in FIGS. 1a and 1b. Although the embodiments of the diodes according to the present invention are rotationally symmetric, approaches which are not rotationally symmetric are also conceivable. It is essential that at least one part, either the base or the lead wire, has at least one predefinable bulge or undercut which protrudes into the plastic and forms a fixed connection when the plastic is firm, but which connection disengages when the plastic is soft, particularly liquid, i.e., at high temperatures.

The electrical component according to the present invention, a diode for example, differs from the diodes described in published German patent documents DE 43 41 269 and DE 195 49 202 due to the type and manufacture of undercut 8 on diode base 1 and/or undercut 8a on lead wire 2. Detailed information about the manufacture of diodes is given in FIGS. 2, 3, and 4.

Figure 2:
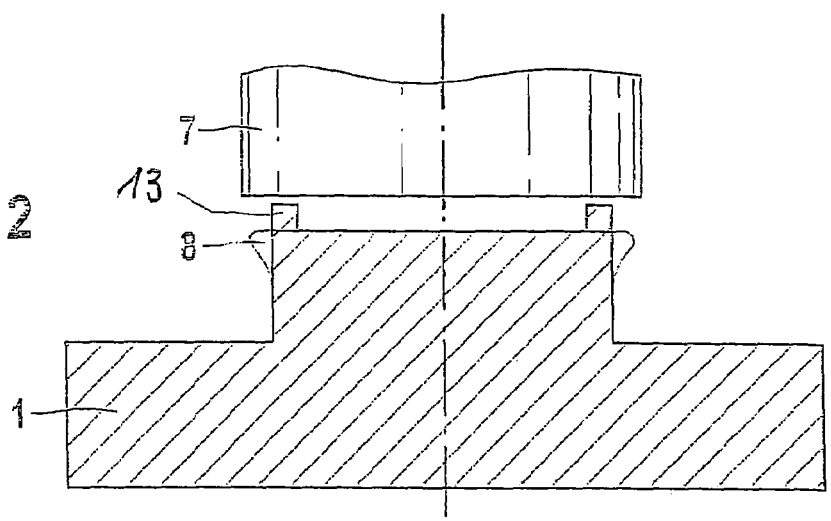
FIG. 2 illustrates an exemplary method of manufacturing a portion of a press-in diode according to the present invention.

FIG. 2 shows how an undercut 8 on base 1 of the diode according to the present invention may be created using a punching tool 7 or, if needed, by further processing. Undercut 8 may be designed as a circumferential collar. Punching tool 7 exerts a pressure on, for example, rotationally symmetric area 13 and deforms it. This deformation does not reduce the surface of the base facing the chip after assembly. The undercut is planed in an additional second work step. This creates undercut 8 on the diode base illustrated in FIG. 1b which, together with the adjacent surface of the base, forms an optimally large supporting surface onto which the chip may be deposited.

Figure 3:
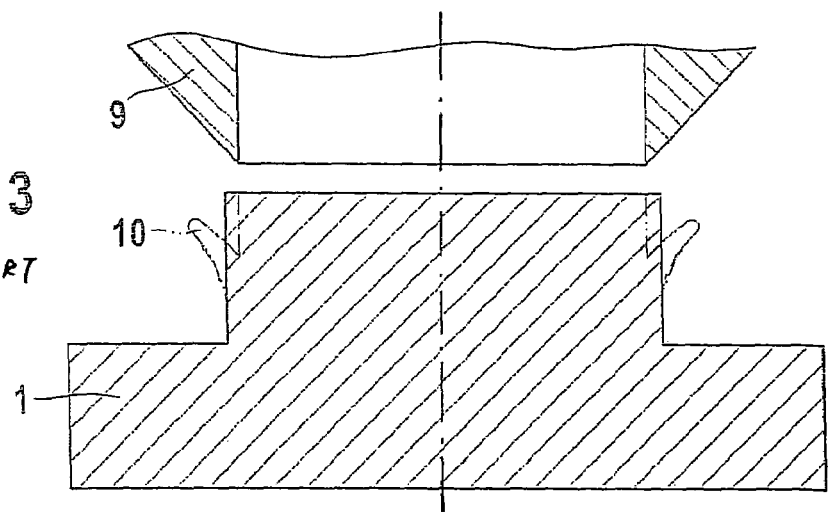
FIG. 3 illustrates a conventional method of manufacturing a portion of a press-in diode.

In contrast to this, in the manufacturing method known from published German patent document DE 195 49 202 and outlined in FIG. 3, part of base 1 is peeled and formed into bulge 10 using a cylindrical peeling tool 9, the bulge forming a circumferential collar. The surface of base 1 is reduced here, while in the approach according to the present invention shown in FIG. 2, the surface of base 1 and thus the chip-supporting surface is not reduced.

Figure 4:
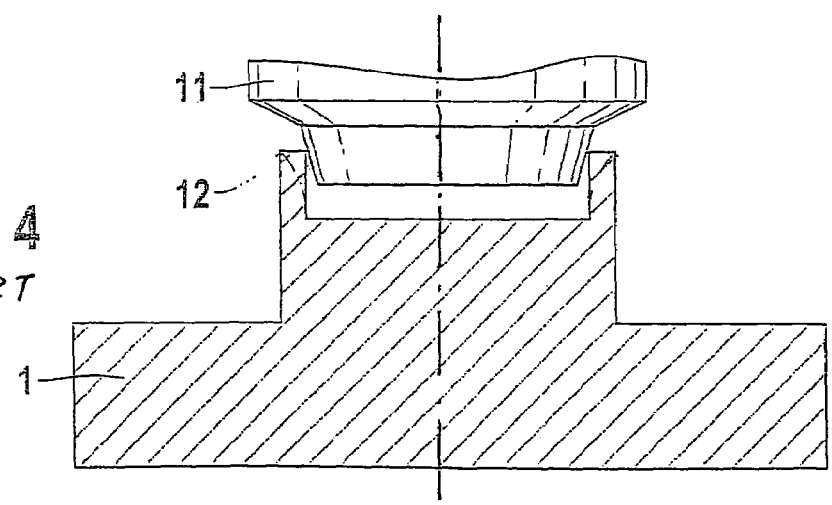
FIG. 4 illustrates a conventional method of manufacturing a portion of a press-in diode.

FIG. 4 shows another possibility for creating a collar for the base of a press-in diode which is known from published German patent document DE 43 41 269. A rotationally symmetric extension 12 of base 1 is used here for creating the collar of the base, the extension being given a desired form using a form tool 11.

Identical measure b creates a maximum diameter A of the chip-supporting surface, as shown in FIGS. 1a and 1b. The housing according to the present invention formed by base 1, sleeve 5, plastic 6, and lead wire 2 may accommodate a larger silicon chip than the known housing and is therefore suited for higher currents. In an embodiment in which diameter B equals 10.3 mm, B being the inside diameter of the plastic sleeve, the chip-supporting surface on a base according to published German patent document DE 195 49 202 may have a maximum diameter A of 8 mm; in the embodiment according to the present invention, however, it may have a maximum of 9.2 mm.

The same is true for the comparison with the embodiment according to published German patent document DE 43 41 269. In this known approach, the wall thickness of the collar always takes up part of the chip-supporting surface, so that this surface will always be smaller than is the case in the approach according to the present invention.

Using the height and the wall thickness of the collar, measure a of undercut 8 (e.g., shown in FIG. 1b) may be adjusted in the approach according to the present invention. Measure a should be selected in such a way that, at the diode's normal operating temperature of, for example, a maximum of 230° C., plastic 6 sufficiently clamps lead wire 2 and base 1. In the event of inadvertent polarity reversal of the battery in the motor vehicle, when the positive pole of the battery is connected to the diode's anode and the negative pole is connected to the cathode, the diode should interrupt the current flow before the plastic insulation of the alternator or the battery cable ignites due to overheating. This requirement may be met if the clamp-type connection in the diode is released at a maximum of 400° C. as a result of the softening of used plastic 6 and subsequent disengagement of the base 1 and lead wire 2.

The thermal expansion of the diode's plastic in a concrete example equals 30 ppm/K. Together with the thermal expansion of copper, the diode base material, a calculation results in a maximum undercut a of approximately 0.05 mm. Such small undercuts are not producible using the methods as described in the published German patent documents DE 43 41 269 or DE 195 49 202. Typical values in the known approaches lie around 0.2 mm.

The design of the lead wire according to FIG. 1b supports the opening of the diode during polarity reversal of the battery if, also in this case, undercut a does not exceed 0.05 mm. As an additional advantage of this lead wire, it should be pointed out that measure l is minimized in comparison with the known approaches. As explained in published German patent document DE 43 41 269, the diode's plastic sheathing may absorb an increasing tensile load as l decreases. Typical values of l for the known housings lie around l=1 mm; however, for the approach according to the present invention, the typical values of l lie around l=0.5 mm.

In summary, the present invention provides a press-in diode for high currents including built-in polarity reversal protection since the clamp-type connection is automatically released in the event of overheating caused by polarity reversal.

What is claimed is:

1. A press-in diode, comprising:
a base;
a chip operatively connected to the base by a first soldering layer;
a lead wire operatively connected to the chip by a second soldering layer;
a plastic sheathing laterally surrounding at least the chip and regions of the base and the lead wire adjacent to the chip; and
a protective sleeve laterally enclosing the plastic sheathing;
wherein the base and the lead wire each have a predefined bulge that laterally protrudes into the plastic sheathing, whereby a clamp-type connection between the base and the lead wire is formed by the interaction of the bulges with the plastic sheathing enclosed by the protective sleeve and each predefined bulge has a maximum lateral value of 0.05 mm.

2. The press-in diode according to claim 1, wherein the diode is an integral part of a rectifier system.

3. The press-in diode according to claim 1, wherein the bulges are rotationally symmetric.

4. The press-in diode according to claim 3, wherein the plastic sheathing is made of a plastic that is firm in a first temperature range and is soft in a second, higher temperature range.

5. The press-in diode according to claim 1, wherein the bulges are rotationally symmetric, wherein the diode is an integral part of a rectifier system, wherein the plastic sheathing is made of a plastic that is firm in a first temperature range and is soft in a second, higher temperature range, and wherein the clamp-type connection between the base and the lead wire is ensured when the plastic is firm, wherein a release of the clamp-type connection occurs when the plastic is soft, and wherein an electrical connection among the base, the chip and the lead wire is interrupted when the clamp-type connection is released.

6. The press-in diode according to claim 5, wherein the first temperature range has a maximum of 400° C.

7. The press-in diode according to claim 1, wherein the plastic sheathing is made of a plastic that is firm in a first temperature range and is soft in a second, higher temperature range.

8. The press-in diode according to claim 7, wherein the first temperature range has a maximum of 400° C.

9. The press-in diode according to claim 7, wherein the clamp-type connection between the base and the lead wire is ensured when the plastic is firm, and wherein a release of the clamp-type connection occurs when the plastic is soft.

10. The press-in diode according to claim 9, wherein an electrical connection among the base, the chip and the lead wire is interrupted when the clamp-type connection is released.

* * * * *